United States Patent
Ma et al.

(10) Patent No.: US 9,183,335 B2
(45) Date of Patent: Nov. 10, 2015

(54) DYNAMIC POWER DRIVEN CLOCK TREE SYNTHESIS (CTS)

(71) Applicant: Synopsys, Inc., Mountain View, CA (US)

(72) Inventors: Xiaojun Ma, Santa Clara, CA (US); Aiqun Cao, Sunnyvale, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/222,456

(22) Filed: Mar. 21, 2014

(65) Prior Publication Data

US 2014/0289685 A1    Sep. 25, 2014

Related U.S. Application Data

(60) Provisional application No. 61/804,121, filed on Mar. 21, 2013.

(51) Int. Cl.
*G06F 17/50* (2006.01)
*G06F 1/10* (2006.01)

(52) U.S. Cl.
CPC ............... *G06F 17/505* (2013.01); *G06F 1/10* (2013.01); *G06F 17/5045* (2013.01)

(58) Field of Classification Search
CPC ............ G06F 17/5045; G06F 17/5068; G06F 17/505; G06F 17/5031; G06F 2217/78; G06F 2217/84; H01L 27/0207; H01L 21/8238; G06N 3/126; H03K 19/0013
USPC .................................. 716/102, 103, 104, 133
See application file for complete search history.

(56) References Cited

U.S. PATENT DOCUMENTS

| | | | |
|---|---|---|---|
| 5,612,636 A * | 3/1997 | Ko | 326/83 |
| 5,787,011 A * | 7/1998 | Ko | 326/103 |
| 7,216,322 B2 | 5/2007 | Lai et al. | |
| 7,418,675 B2 | 8/2008 | Macdonald et al. | |
| 7,496,867 B2 | 2/2009 | Turner et al. | |
| 8,572,418 B2 | 10/2013 | Singasani | |
| 2003/0182637 A1* | 9/2003 | Kurose et al. | 716/1 |
| 2008/0066043 A1 | 3/2008 | Lin | |
| 2008/0244474 A1* | 10/2008 | Turner et al. | 716/2 |
| 2011/0252392 A1* | 10/2011 | Saika | 716/119 |

* cited by examiner

*Primary Examiner* — Vuthe Siek
(74) *Attorney, Agent, or Firm* — Park, Vaughan, Fleming & Dowler LLP

(57) ABSTRACT

Dynamic power driven clock tree synthesis is described. Some embodiments can select one or more cells from a cell library based on power ratios of cells in the cell library. The embodiments can then construct a clock tree based on the one or more cells.

15 Claims, 2 Drawing Sheets

DYNAMIC POWER DRIVEN CLOCK TREE SYNTHESIS (CTS)

RELATED APPLICATION

This application claims priority to U.S. Provisional Patent Application No. 61/804,121, by the same inventors, filed on 21 Mar. 2013, the contents of which are herein incorporated by reference in their entirety for all purposes.

BACKGROUND

1. Technical Field

This disclosure relates to clock tree synthesis (CTS). More specifically, this disclosure relates to dynamic power driven CTS.

2. Related Art

CTS refers to the process of creating a clock distribution network (or clock tree) for distributing a clock signal to a set of clock sinks (e.g., clock inputs of sequential circuit elements) in a circuit design. A clock sink can generally refer to any circuit element to which a clock signal is provided, and a sequential circuit element can generally refer to any circuit element that is timed using a clock signal. A "D flip-flop" is an example of a sequential circuit element. A circuit design may include multiple clock domains, and each clock domain can include multiple clock trees. Clock trees can consume a significant amount of dynamic power. Hence, what are needed are systems and techniques for CTS that create clock trees that consume less dynamic power.

SUMMARY

Some embodiments described herein provide systems and techniques for dynamic power driven clock tree synthesis. Some embodiments can select one or more cells from a cell library (e.g., a cell library that contains clock buffers and inverters) based on power ratios of cells in the cell library. Specifically, some embodiments select a predetermined number of cells with lowest power ratios in the cell library, e.g., m cells with the lowest power ratios, where m≥1. The embodiments can then construct a clock tree based on the selected one or more cells.

According to one definition, the power ratio of a cell is an expected amount of dynamic power consumption of a clock tree, wherein the clock tree drives a unit capacitive load, and wherein the clock tree is built using the cell.

Some embodiments construct the clock tree based on the one or more cells by constructing an initial clock tree based on the one or more cells, and then modifying one or more cell sizes in the initial clock tree to optimize one or more metrics, which can include, but are not limited to, clock latency, dynamic power consumption, clock skew, timing slack, and area.

DETAILED DESCRIPTION

Figure 1:
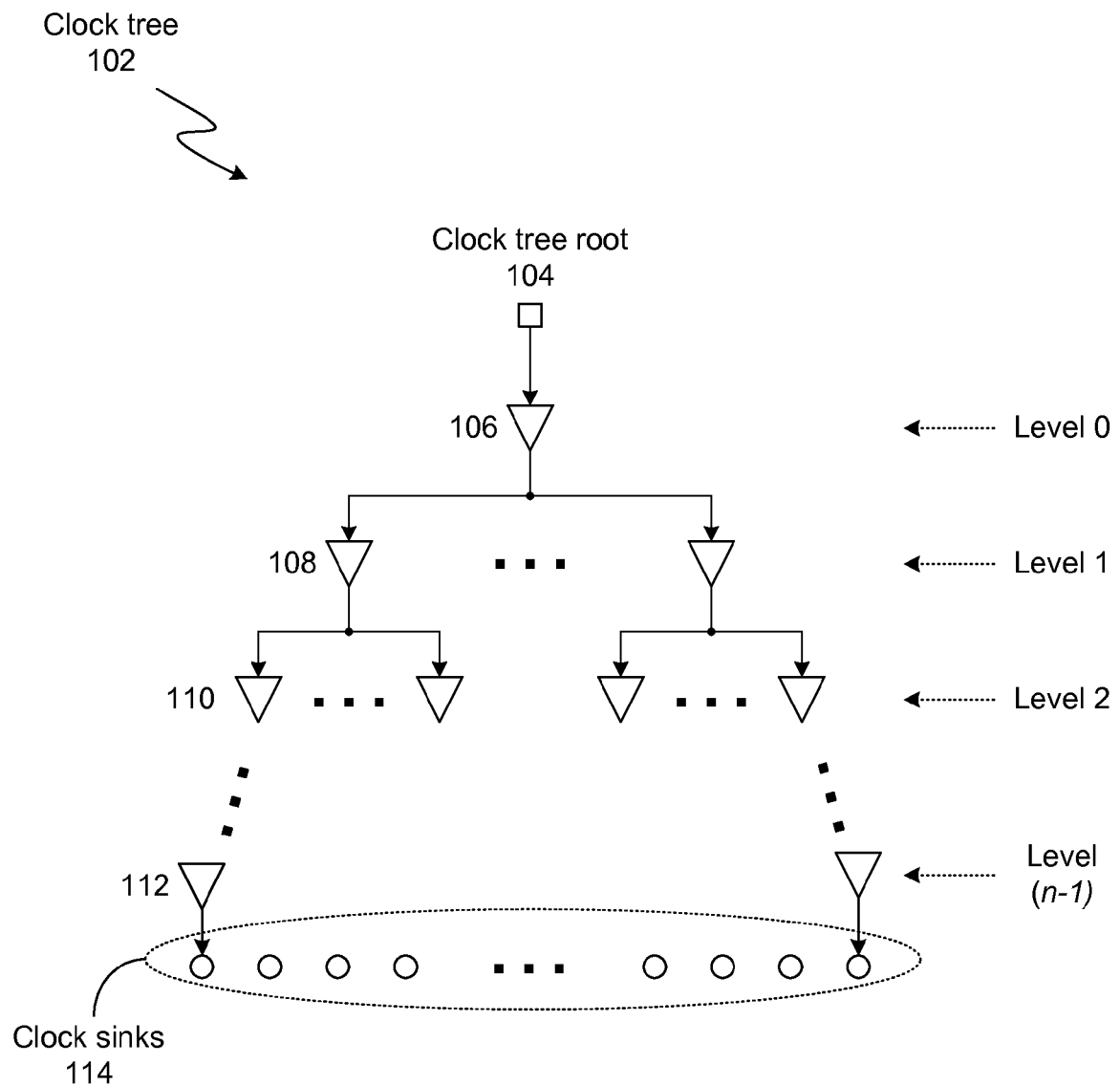
FIG. 1 illustrates how a power ratio for a cell can be derived in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z. Additionally, in this disclosure, the term "based on" or "based at least on" means "based solely or partially on."

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Dynamic Power Driven CTS

Dynamic power consumption refers to the amount of power that a cell consumes while switching. Since clock trees distribute a clock signal, the cells in a clock tree are always switching (except of course when the clock is disabled). Consequently, even though the number of cells in the clock tree is typically a small fraction of the total number of cells in the circuit design, the clock tree can consume a disproportionately large fraction of dynamic power. Therefore, given a set of placed sequential circuit elements, what are needed are systems and techniques for constructing a clock tree that consumes the minimum amount of dynamic power and that distributes the clock signal to the set of placed sequential circuit element.

Conventional approaches for constructing low dynamic power clock trees have many drawbacks. Some conventional approaches merely use the largest buffer or inverter (e.g., the buffer or inverter with the largest area or driving strength) to construct the clock tree. However, the largest buffer or inverter may not result in the minimum dynamic power. Some conventional approaches only use inverters; others only use buffers. However, in some cases using inverters may result in the minimum dynamic power, and in other cases using buffers may result in the minimum dynamic power. Therefore, conventional approaches that are restricted to only using buffers or restricted to only using inverters may not be able to construct a clock tree with the minimum dynamic power in all situations.

Some conventional approaches use a proxy for dynamic power consumption. For example, the number of cells in the clock tree is sometimes used as a proxy for the dynamic power consumption of the clock tree. However, minimizing the number of cells in the clock tree may not minimize the dynamic power consumption. Moreover, this metric—number of cells—cannot be used to correctly choose between a buffer tree and an inverter tree because each buffer cell is essentially equivalent to two inverter cells.

Some conventional approaches use the total cell area as a proxy for dynamic power consumption. Again, this is a poor proxy. Reducing area may not reduce dynamic power consumption. Additionally, some cell libraries are intentionally designed so that the library cells have approximately the same area, which drastically reduces or eliminates the correlation between area and dynamic power consumption.

Some embodiments described herein can construct minimum dynamic power clock trees without the above-described drawbacks of conventional approaches. Specifically, some embodiments compute a metric (e.g., the power ratio described below) for each cell in the cell library. Next, the embodiments select one or more cells based on the metric, and construct the clock tree based on the selected one or more cells. An important feature of these embodiments is that the one or more optimal cells can be selected by performing library analysis, i.e., the one or more optimal cells can be selected even before the circuit design has been created. Once the one or more optimal cells have been selected, the selected cells can then be used to build a minimum dynamic power clock tree regardless of the number of sequential circuit elements and/or the placement of sequential circuit elements in the circuit design.

FIG. 1 illustrates how a power ratio for a cell can be derived in accordance with some embodiments described herein. Clock tree 102 distributes a clock signal to clock sinks 114. A clock sink can generally be any circuitry that receives a clock signal from a clock tree. For example, the clock input of a sequential circuit element can be a clock sink. Clock tree 102 includes multiple levels, e.g., levels $0, 1, 2, \ldots, (n-1)$. In FIG. 1, each level is assumed to have the same fanout, g, and all cells in clock tree 102 are assumed to be identical.

Note that level i has $g^i$ cells. Cell 106 in level 0 drives g cells in level 1. Each of the g cells in level 1, e.g., cell 108, drives g cells in level 2. Each of the $g^2$ cells in level 2, e.g., cell 110, drives g cells in level 3, and so forth. Finally, each of the $g^{(n-1)}$ cells in level (n−1), e.g., cell 112, drives one or more clock sinks.

Next, we derive an expression for the dynamic power consumption of clock tree 102. This derivation uses an important result from logical effort theory which is described in Ivan Sutherland, Robert F. Sproull, and David Harris, *Logical Effort: Designing Fast CMOS Circuits*, Morgan Kaufmann, 1999. Logical effort theory uses a linear cell delay model that is based on the logical effort, electrical effort, and parasitic delay of a cell. The logical effort captures the complexity of the logical function that is being performed by the cell and is generally independent of the size of the transistors in the cell. The electrical effort describes represents the ratio of the output capacitance to the input capacitance. The parasitic delay is a form of delay overhead that accompanies any gate and is also generally independent of transistor sizes and output loading.

An important result in logical effort theory is that the delay of a buffer or inverter tree (e.g., the delay from clock tree root 104 to clock sinks 114) is minimized when the stage effort of each level in the buffer or inverter tree is the same. Further details of the derivation of this result can be found in Ivan Sutherland, Robert F. Sproull, and David Harris, *Logical Effort: Designing Fast CMOS Circuits*, Morgan Kaufmann, 1999. Applying this result to the clock tree in FIG. 1 we conclude that the delay from clock tree root 104 to clock sinks 114 is minimized when the ratio between the total output capacitive load and the total input capacitance for each level is the same.

Let $C_i$ be the input capacitance of each cell in clock tree 102 (recall that all cells in clock tree 102 are identical). For level 0, the total output capacitive load is $g \cdot C_i$ and the ratio between the total capacitive load and the total input capacitance for level 0 is g. Likewise, the ratio between the total capacitive load and the total input capacitance for levels 1 through (n−2) is also g because each cell in each level drives exactly g cells in the next level.

Now, let the total output capacitive load at level (n−1), i.e., the sum of the capacitances of clock sinks 114, be $C_o$. Then, for level (n−1), the ratio between the total capacitive load and the total input capacitance is $C_o/(g^{n-1} \cdot C_i)$. As mentioned above, the minimum delay is achieved when the ratio between the total output capacitive load and the total input capacitance for each level is the same. Therefore, in FIG. 1, the delay from clock tree root 104 to clock sinks 114 is minimized when the following equality holds:

$$\frac{C_o}{(g^{n-1} \cdot C_i)} = g. \tag{1}$$

Solving for n, we get:

$$n = \log_g\left(\frac{C_o}{C_i}\right). \tag{2}$$

Now, let P be the dynamic power consumption of each cell in clock tree 102 (recall that all cells in clock tree 102 are identical). Then, the total power of the clock tree, $P_T$, is given by the following equation:

$$P_T = \tag{3}$$

$$P \cdot \left(\frac{g^{\log_g(C_o/C_i)} - 1}{g - 1}\right) = P \cdot \left(\frac{(C_o/C_i) - 1}{g - 1}\right) \approx \frac{P}{C_i \cdot (g-1)} \cdot C_o = r \cdot C_o,$$

where r is the power ratio of a cell and is given by:

$$r = \frac{P}{C_i \cdot (g-1)}. \tag{4}$$

Note that the power ratio is independent of the total output capacitive load, $C_o$. Specifically, according to one definition, the power ratio of a cell is the expected amount of dynamic power consumption of a clock tree per unit output capacitive load. Note that, regardless of the value of the total output capacitive load, the cell that will result in the clock tree with the lowest dynamic power consumption is the cell that has the lowest power ratio. This is an important insight that is used by some embodiments described herein.

In some embodiments, the fanout ratio g can be a predetermined value, e.g., g=3, g=4, etc. In some embodiments, an optimal fanout ratio can be determined, and then the optimal fanout ratio can be used to determine the power ratios for the different library cells. For example, the optimal fanout ratio can be determined using logical effort theory (further details of a technique for determining the optimal fanout ratio or step-up ratio can be found in Ivan Sutherland, Robert F. Sproull, and David Harris, *Logical Effort: Designing Fast CMOS Circuits*, Morgan Kaufmann, 1999). Alternatively, some embodiments can build trees using different fanout ratios, and then determine the fanout ratio that results in the lowest delay in the tree. Once the optimal fanout ratio has been determined, the optimal fanout ratio can then be used to compute the power ratios.

Figure 2:
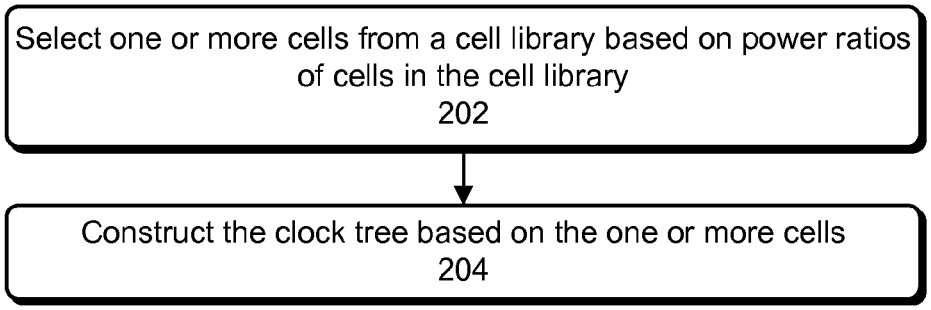
FIG. 2 illustrates a process for dynamic power driven CTS in accordance with some embodiments described herein.

FIG. 2 illustrates a process for dynamic power driven CTS in accordance with some embodiments described herein. The process can begin by selecting one or more cells from a cell library based on power ratios of cells in the cell library (operation 202). The cell library can include buffers, inverters, and/or any other cells that can be used to build a clock tree. As mentioned above, according to one definition, a power ratio of a cell is equal to an expected amount of dynamic power consumption of a clock tree when the clock tree drives a unit capacitive load, and wherein the clock tree is built using the cell.

In some embodiments, once the power ratios of the cells have been determined, one or more cells with the lowest power ratios can be selected. Specifically, the cells with the lowest m power ratios can be selected, where m≥1 (e.g., the cells can be sorted in increasing order of their power ratios and then the first m cells can be selected from the sorted list). In some embodiments, m=1, i.e., the process may select the cell with the minimum power ratio.

In some embodiments, the process can evaluate an objective function for each cell in the cell library. The objective function can include multiple components or terms that related to different characteristics of the cell (e.g., power ratio, area, leakage power, etc.). Using an objective function can allow the process to balance multiple factors, e.g., dynamic power and area. Next, one or more cells can be selected based on their object function values.

Next, the process can construct the clock tree based on the one or more cells (operation 204). For example, the process can construct a clock tree as shown in FIG. 1, namely, a clock tree that has ⌈n−1⌉ levels, wherein n is given by Equation (2), wherein each cell in each level drives g cells in the next level, and wherein each cell in level ⌈n−1⌉ drives a cluster of one or more clock sinks (the ceiling function has been used because the right hand side of Equation (2) is a real value). The clock sinks can be clustered so that the total capacitive load of each cluster of clock sinks is approximately equal to $C_i$. If a particular cell in level ⌈n−1⌉ is driving a cluster of clock sinks whose aggregate capacitive load is substantially less than then the cell can be downsized to further optimize dynamic power consumption.

Note that the power ratio expression shown in Equation (4) was derived based on certain assumptions. Therefore, in certain circuit designs, the cell that has the minimum power ratio may not result in the minimum dynamic power clock tree. Specifically, in some embodiments, the process can select multiple cells with low power ratios (e.g., cells with the lowest m power ratios). Next, for each of the selected cells, the process can build a clock tree. The process can then select the clock tree from these multiple clock trees that has the lowest dynamic power consumption (the process can also use other metrics, such as delay and area, to select an optimal clock tree from the multiple clock trees).

In some embodiments, the process can construct an initial clock tree based on the one or more cells (e.g., the m library cells with the lowest power ratios). Next, the process can modify one or more cell sizes in the initial clock tree to optimize one or more metrics. For example, if a particular cell in level ⌈n−1⌉ is driving a cluster of clock sinks whose aggregate capacitive load is substantially less than $C_i$, then the cell can be downsized (e.g., by replacing the cell by a logically equivalent cell that has a smaller area and/or drive strength) thereby further reducing dynamic power consumption and/or area of the clock tree. Other metrics that can be optimized by modifying cell sizes include maximum clock latency (the maximum clock latency can be defined as the maximum delay from the root of the clock tree to the clock sinks), clock skew (the clock skew can be defined as the difference between the minimum clock latency and the maximum clock latency across all clock sinks), and timing slack (the timing slack can be defined as the difference between the time when a data signal is expected to arrive at pin and the time when the data signal is required to arrive at the pin for correct operation of the circuit design).

Computer System

Figure 3:
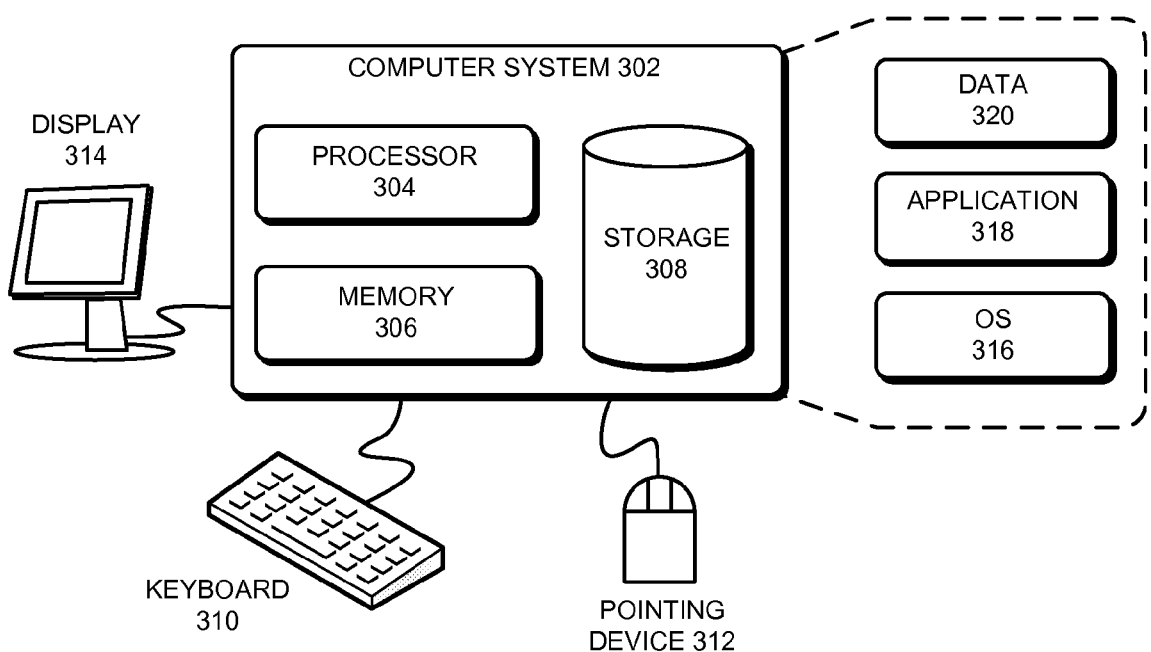
FIG. 3 illustrates a computer system in accordance with some embodiments described herein.

FIG. 3 illustrates a computer system in accordance with some embodiments described herein. Computer system 302 can include processor 304, memory 306, and storage device 308. Computer system 302 can be coupled to display device 314, keyboard 310, and pointing device 312. Storage device 308 can store operating system 316, application 318, and data 320. Data 320 can include input required by application 318 and/or output generated by application 318.

Computer system 302 may automatically (or with user interaction) perform one or more operations that are implicitly or explicitly described in this disclosure. Specifically, during operation, computer system 302 can load application 318 into memory 306. Application 318 can then be used to perform dynamic power driven CTS.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) software tool, method for clock tree synthesis, the method comprising:
the EDA software tool in a computer selecting one or more cells from a cell library based at least on power ratios of cells in the cell library, wherein a power ratio of a cell is equal to an expected amount of dynamic power consumption of a clock tree when the clock tree drives a unit capacitive load, and wherein the clock tree is built using the cell; and
the EDA software tool in the computer constructing a clock tree based on the one or more cells.

2. The method of claim 1, wherein selecting the one or more cells from the cell library comprises selecting a predetermined number of cells with lowest power ratios in the cell library.

3. The method of claim 1, wherein selecting the one or more cells from the cell library comprises:
for each cell in the cell library, evaluating an objective function based at least on the power ratio of the cell; and
selecting the one or more cells based at least on objective function values of cells in the cell library.

4. The method of claim 1, wherein constructing the clock tree based on the one or more cells comprises:
constructing an initial clock tree based on the one or more cells; and
modifying one or more cell sizes in the initial clock tree to optimize one or more metrics.

5. The method of claim 4, wherein the one or more metrics include one or more of: clock latency, dynamic power consumption, clock skew, timing slack, and area.

6. A non-transitory computer-readable storage medium storing instructions for an electronic design automation (EDA) software tool that, when executed by a computer, cause the computer to perform a method for clock tree synthesis, the method comprising:
selecting one or more cells from a cell library based at least on power ratios of cells in the cell library, wherein a power ratio of a cell is equal to an expected amount of dynamic power consumption of a clock tree when the clock tree drives a unit capacitive load, and wherein the clock tree is built using the cell; and
constructing a clock tree based on the one or more cells.

7. The non-transitory computer-readable storage medium of claim 6, wherein selecting the one or more cells from the cell library comprises selecting a predetermined number of cells with lowest power ratios in the cell library.

8. The non-transitory computer-readable storage medium of claim 6, wherein selecting the one or more cells from the cell library comprises:
for each cell in the cell library, evaluating an objective function based at least on the power ratio of the cell; and
selecting the one or more cells based at least on objective function values of cells in the cell library.

9. The non-transitory computer-readable storage medium of claim 6, wherein constructing the clock tree based on the one or more cells comprises:
constructing an initial clock tree based on the one or more cells; and
modifying one or more cell sizes in the initial clock tree to optimize one or more metrics.

10. The non-transitory computer-readable storage medium of claim 9, wherein the one or more metrics include one or more of: clock latency, dynamic power consumption, clock skew, timing slack, and area.

11. An apparatus, comprising:
a processor; and
a non-transitory computer-readable storage medium storing instructions for an electronic design automation (EDA) software tool that, when executed by a computer, cause the computer to perform a method for clock tree synthesis, the method comprising:
selecting one or more cells from a cell library based at least on power ratios of cells in the cell library, wherein a power ratio of a cell is equal to an expected amount of dynamic power consumption of a clock tree when the clock tree drives a unit capacitive load, and wherein the clock tree is built using the cell; and
constructing a clock tree based on the one or more cells.

12. The apparatus of claim 11, wherein selecting the one or more cells from the cell library comprises selecting a predetermined number of cells with lowest power ratios in the cell library.

13. The apparatus of claim 11, wherein selecting the one or more cells from the cell library comprises:
for each cell in the cell library, evaluating an objective function based at least on the power ratio of the cell; and
selecting the one or more cells based at least on objective function values of cells in the cell library.

14. The apparatus of claim 11, wherein constructing the clock tree based on the one or more cells comprises:
constructing an initial clock tree based on the one or more cells; and
modifying one or more cell sizes in the initial clock tree to optimize one or more metrics.

15. The apparatus of claim 14, wherein the one or more metrics include one or more of: clock latency, dynamic power consumption, clock skew, timing slack, and area.

* * * * *